(12) United States Patent
Bucchignano et al.

(10) Patent No.: US 7,566,527 B2
(45) Date of Patent: Jul. 28, 2009

(54) FUSED AROMATIC STRUCTURES AND METHODS FOR PHOTOLITHOGRAPHIC APPLICATIONS

(75) Inventors: James J. Bucchignano, Yorktown Heights, NY (US); Wu-Song Huang, Poughkeepsie, NY (US); Pushkara R. Varanasi, Poughkeepsie, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 11/769,089

(22) Filed: Jun. 27, 2007

(65) Prior Publication Data

US 2009/0004596 A1 Jan. 1, 2009

(51) Int. Cl.
*G03F 7/039* (2006.01)
*G03F 7/20* (2006.01)
*G03F 7/30* (2006.01)
*G03F 7/36* (2006.01)
*G03F 7/38* (2006.01)

(52) U.S. Cl. .................. 430/326; 430/330; 430/313; 430/323; 430/270.1; 430/272.1; 430/942

(58) Field of Classification Search .................. None
See application file for complete search history.

(56) References Cited

U.S. PATENT DOCUMENTS

| | | | |
|---|---|---|---|
| 5,272,042 A | 12/1993 | Allen et al. | |
| 5,340,686 A | 8/1994 | Sakaguchi et al. | |
| 5,380,881 A | 1/1995 | Schadeli | |
| 5,677,112 A | 10/1997 | Urano et al. | |
| 5,712,078 A | 1/1998 | Huang et al. | |
| 6,303,263 B1 | 10/2001 | Chen et al. | |
| 6,706,461 B1 | 3/2004 | Sinta et al. | |
| 7,014,980 B2 | 3/2006 | Allen et al. | |
| 7,083,892 B2 | 8/2006 | Takahashi et al. | |
| 7,129,016 B2 | 10/2006 | Khojasteh et al. | |
| 7,141,692 B2 | 11/2006 | Allen et al. | |
| 7,183,036 B2 | 2/2007 | Khojasteh et al. | |
| 2004/0058272 A1* | 3/2004 | Takahashi et al. | 430/270.1 |
| 2006/0063103 A1 | 3/2006 | Huang et al. | |
| 2006/0194144 A1 | 8/2006 | Sooriyakumaran et al. | |
| 2006/0223000 A1 | 10/2006 | Chandhok et al. | |

\* cited by examiner

*Primary Examiner*—Sin J. Lee
(74) *Attorney, Agent, or Firm*—Schmeiser, Olsen & Watts; Steven Capella

(57) ABSTRACT

A resist composition and a method for forming a patterned feature on a substrate. The composition comprises a molecular glass having at least one fused polycyclic moiety and at least one base soluble functional group protected with an acid labile protecting group, and a photosensitive acid generator. The method includes providing a composition including a photosensitive acid generator and a molecular glass having at least one fused polycyclic moiety and at least one base soluble functional group protected with an acid labile protecting group, forming a film of the composition on the substrate, patternwise imaging the film, wherein at least one region of the film is exposed to radiation or a beam of particles, resulting in production of an acid catalyst in the exposed region, baking the film, developing the film, resulting in removal of base-soluble exposed regions, wherein a patterned feature from the film remains following the removal.

1 Claim, 2 Drawing Sheets

FUSED AROMATIC STRUCTURES AND METHODS FOR PHOTOLITHOGRAPHIC APPLICATIONS

FIELD OF THE INVENTION

The invention relates to material compositions and methods for resists for photolithography.

BACKGROUND OF THE INVENTION

To print 30 nanometer (nm) or sub-30 nm images utilizing photolithography, the resist thickness may be in the range of 50 nm or less. This may be due to the image collapsing during the developing stage. With such a comparatively thin resist, a bilayer or trilayer approach may be utilized. In the trilayer approach, there may be a comparatively thick organic underlayer and a thin Si containing interlayer, where the Si containing layer may either be a chemical vapor deposited silicon oxide layer or a spin coated silsesquioxane polymer film. The resist may be imaged and developed with optical exposure, electron beam (E-beam) or extreme ultraviolet (EUV) first, where the image may be transferred to the interlayer. The interlayer may then act as an etch mask for the underlayer. Since the resist may be comparatively thin to obtain high resolution images, etching through the silicon oxide layer may present a difficult challenge. Therefore, there is a need to develop a photolithographic resist having high etch resistance towards the etchant (such as CF4) of an oxide reactive ion etching (RIE) process, such as a resist suitable for radiation or particle beam exposures.

SUMMARY OF THE INVENTION

The present invention relates to a resist composition comprising:
  a molecular glass having at least one fused polycyclic moiety and at least one base soluble functional group protected with an acid labile protecting group; and
  a photosensitive acid generator.

The present invention relates to a method for forming a patterned feature on a substrate, comprising:
  providing a composition comprising a photosensitive acid generator and a molecular glass having at least one fused polycyclic moiety and at least one base soluble functional group protected with an acid labile protecting group;
  forming a film of said composition on said substrate;
  patternwise imaging said film, wherein at least one region of said film is exposed to radiation or a beam of particles, resulting in production of an acid catalyst in said at least one exposed region of said film;
  after said imaging, baking said film on said substrate; and
  after said baking, developing said film in an aqueous base solution, resulting in removal of base-soluble exposed regions of said film, wherein a patterned feature from said film remains following said removal.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
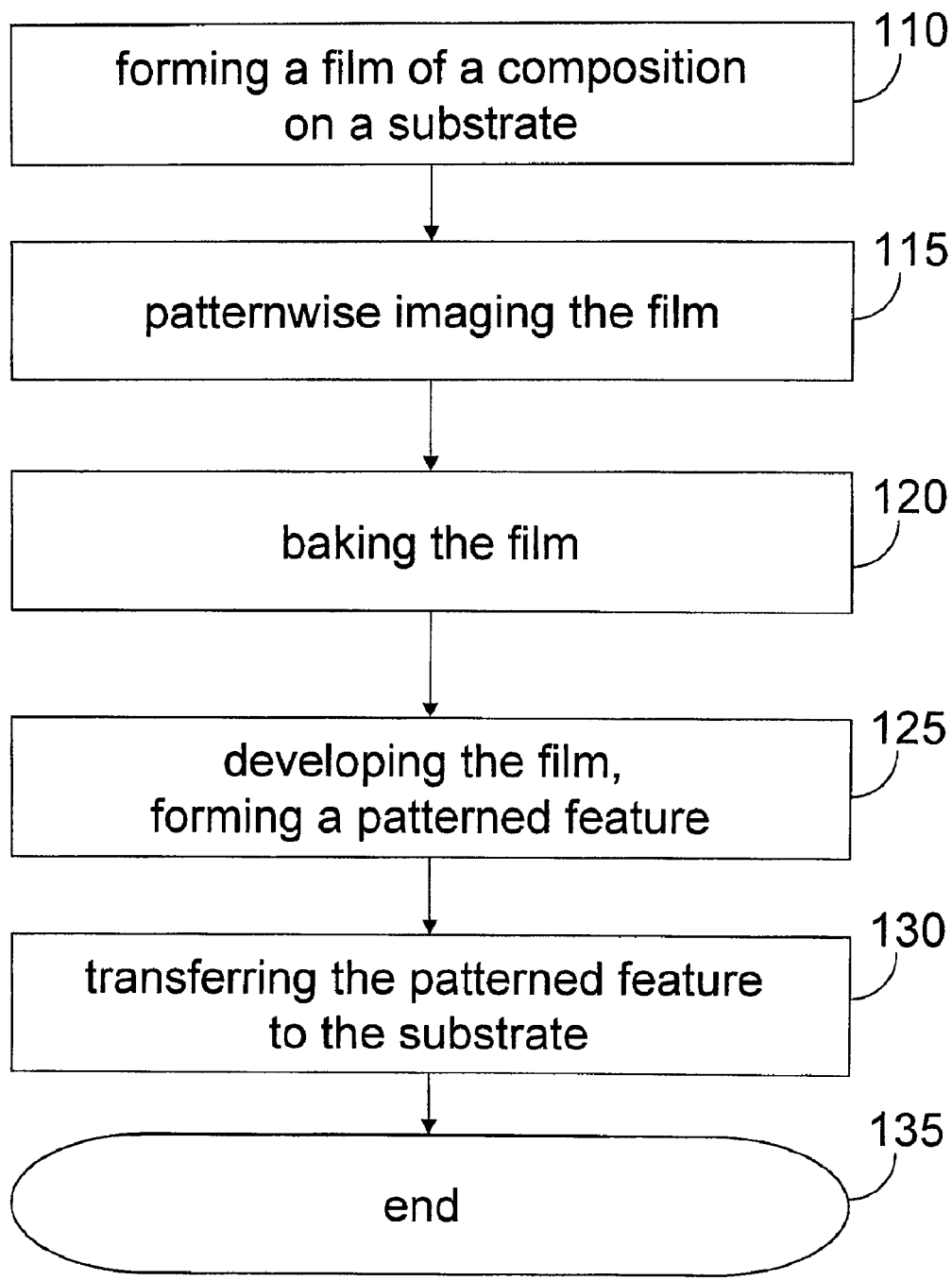
FIG. 1 is a flow chart illustrating a method for preparing a patterned feature on a substrate, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

The fused cyclic systems of the present invention may comprise aromatic and saturated ring moieties based on carbon, such as a benzene ring moiety, or may comprise heterocyclic ring moieties formed with hetero elements in combination with carbon such as furan, pyran, thiophene, or pyrrole groups, for example. The inclusion of aromatic and non-aromatic cyclic moieties in the composition of a resist formulation may increase the etch resistance of the resist. The fused aromatic system described in the present invention may comprise a combination of a benzene ring with at least one other ring structure. If the other ring structure is a benzene moiety, the fused ring moiety may be a fused aromatic moiety such as naphthalene, anthracene, phenanthracene, pyrene, etc. Some examples of these fused aromatic moieties may include:

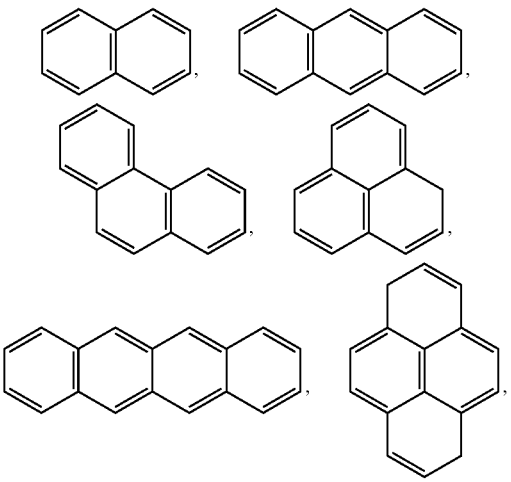

-continued

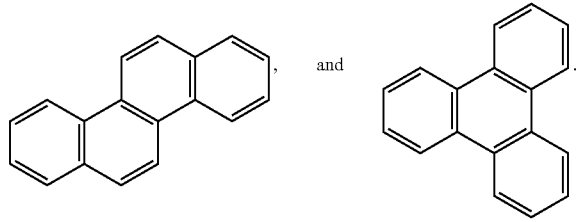

The other ring structure may be a saturated ring, such as cyclobutane, cyclopentane, cyclohexane, cycloheptane, or cyclooctane, for example. Polycyclic structures, such as decalin, norbornene, adamantane, etc., may also be used in combination with a benzene ring structure. Some examples of these fused polycyclic structures may include:

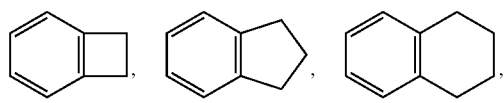

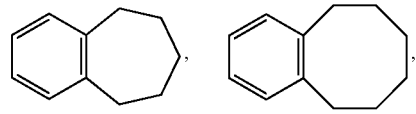

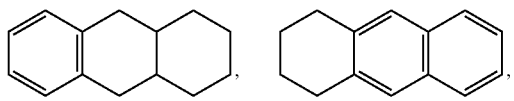

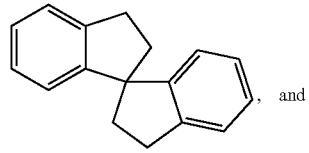

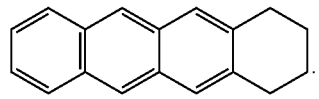

In an embodiment of the present invention, a photolithography resist composition may comprise a compound having at least one fused polycyclic moiety, such as those described above, and at least one base soluble functional group. The base soluble functional group may be, for example, a hydroxyl group, a carboxylic acid group, sulfonamide, dicarboxyimide, N-hydroxy dicarboxyimide, an amino group, an imino group, combinations thereof, and the like. For a chemically amplified resist system, a functional group of a compound may be protected by an acid labile protecting group to change the compound's dissolution rate from high solubility in developer to an extremely low solubility in the developer. During the acid catalyzed chemical amplification process, the protecting group may be removed from the structure in the exposed area of the resist, thus regenerating the unprotected functional group, which may render the compound soluble in developer. The unexposed area may remain insoluble in the developer. The acid catalyzed chemical amplification process may occur immediately following exposure to energy such as from radiation or a particle beam and may immediately follow a thermal bake.

In an embodiment of the present invention, the resist composition may comprise a non-polymeric or low molecular weight compound, such as a molecular glass, incorporating at least one polycyclic moiety. A molecular glass may be described as a low molecular weight compound capable of forming an amorphous film on a substrate. A resist formulation comprising a molecular glass may coated onto a substrate, such as by spin coating, to form an amorphous film. The incorporation of fused cyclic structures into these compounds may improve the etch rate of the compounds over analogous compounds without the fused polycyclic moiety. Such an incorporation may also improve the glass transition temperature, $T_g$, and mechanical properties of the coated film. Some examples of molecular glasses incorporating fused polycyclic moieties may include:

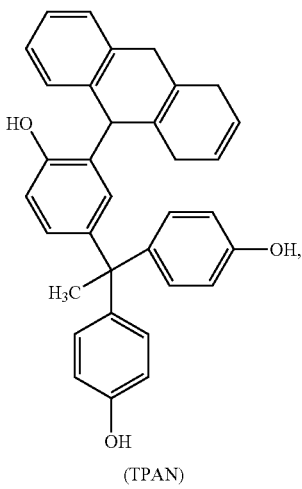
(TPAN)

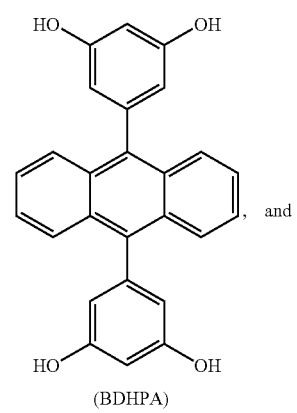
(BDHPA)

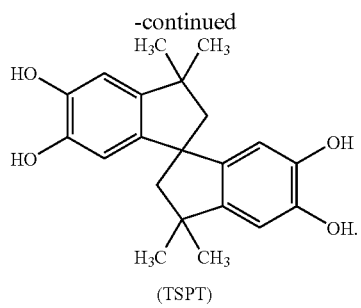

(TSPT)

Resist films prepared using molecular glasses incorporating fused polycyclic moieties may provide improved resolution and decreased line edge roughness versus films prepared using polymers or resins, where such materials used in photoresist applications in the coil state may have a molecular diameter size of about 5 nanometers (nm) or larger. A molecular glass may have a molecular size of about 2 nm or smaller. Molecular chains in a polymer may entangle with neighboring chains. The relatively smaller size of the molecular glass molecules compared to those of the polymer and the absence of entanglement as seen in the polymer chains may improve resolution of resists formulated with molecular glasses, particularly in printing sub 40 nm images.

The base soluble functional group may be protected with an acid labile protecting group, such as an acetal, a ketal, an orthoester group, combinations thereof, and the like. For example, the compound of the resist composition may comprise a compound as described above having at least one hydroxyl group, where at least one hydroxyl group is protected by conversion to a methoxycyclohexyl group (MOCH). Some specific examples of the molecular glasses described above containing MOCH-protected structures may include:

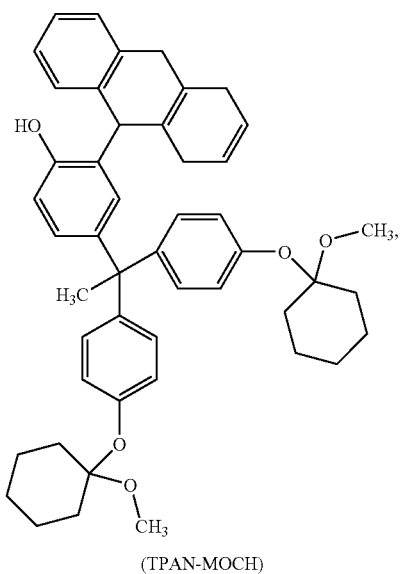

(TPAN-MOCH)

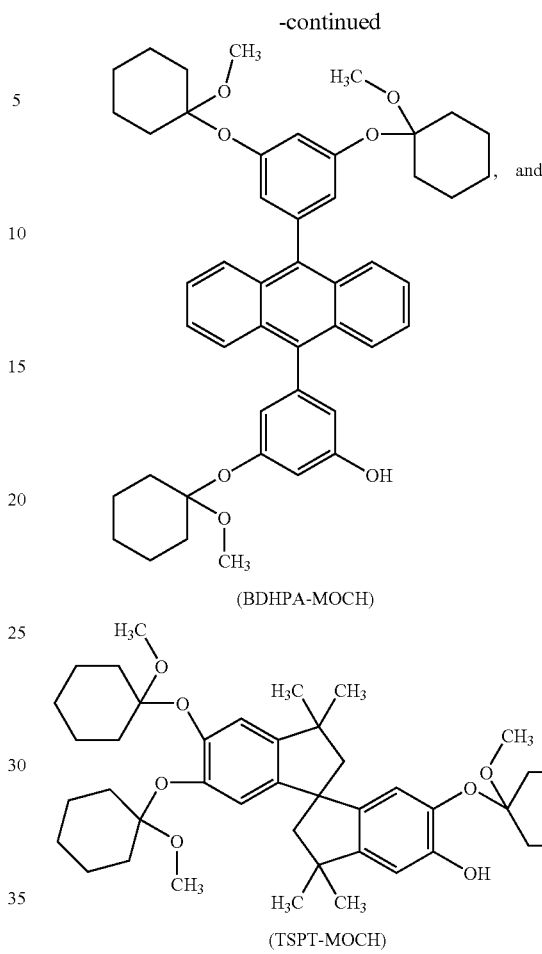

(BDHPA-MOCH)

(TSPT-MOCH)

In an embodiment of the present invention, the resist composition may comprise combinations of two or more molecular glass moieties (such as those derived from the molecular glasses described above) which may be linked with acid cleavable functional group linkages to form linked molecular glasses. An acid cleavable linkage may contain functional groups which may break under an acid catalyzed amplification process. Some examples of acid cleavable functional groups may include carbonates, esters, ethers, acetals, ketals orthoesters, or combinations thereof. For example, acetal type linkages may be formed by reacting base soluble hydroxyl groups with vinyl ethers, divinyl ethers, trivinyl ethers, or combinations thereof. Such linking may improve the glass transition ($T_g$) and mechanical properties of the molecular glasses. A linked molecular glass may have an increased molecular size, as compared with an analogous non-linked molecular glass. The increase may then increase the $T_g$ of the coated film. In the chemical amplification process, a linked network of molecular glass moieties may be broken into smaller molecules (such as individual molecular glass moieties) and still retain the structural and chemical advantages of the smaller molecules. The large linked molecules may have desirable properties such as higher $T_g$ and higher mechanical strength compared with the smaller molecules. A specific example of a structure of a linked molecular glass may include:

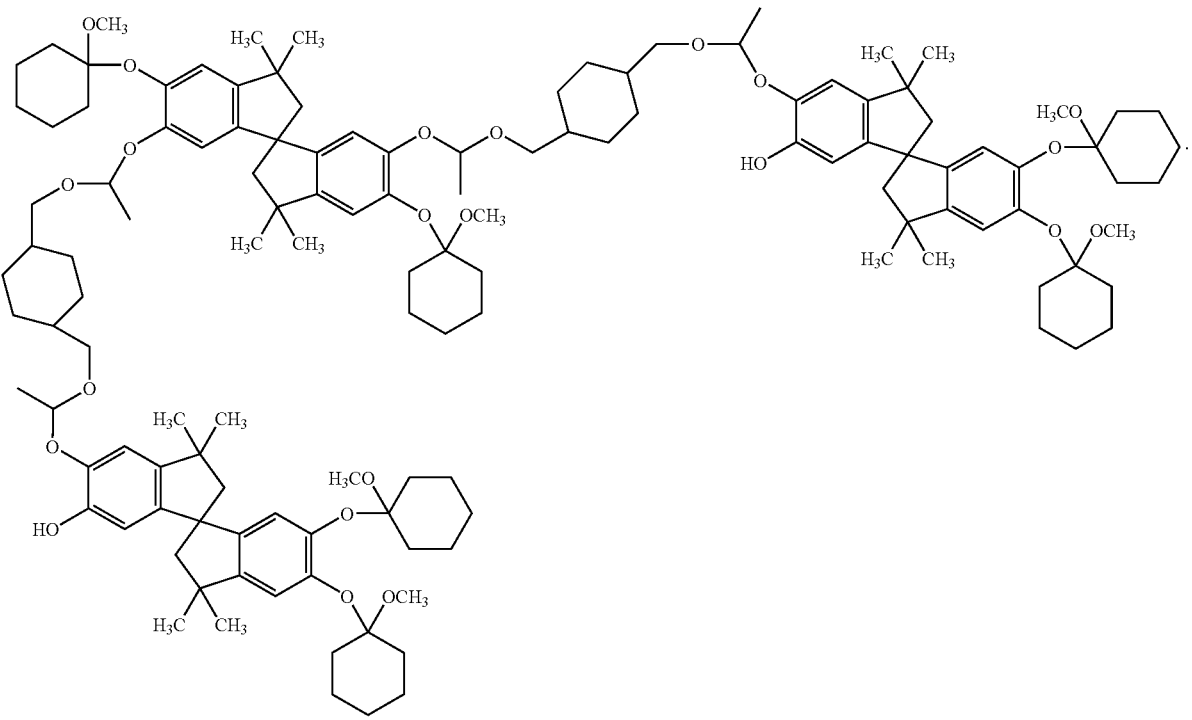

The linkage may be linear, planar or three dimensional, and may comprise a mixture of linked molecular glass moieties of various sizes having a range of molecular weights. The linked molecular glass may comprise at least two molecular glass moieties linked together, and may comprise as many as 100 linked molecular glass moieties, such as between about 2 and about 50 linked molecular glass moieties. By increasing the ratio of linkage moieties to molecular glass moieties, the size and molecular weight of the linked molecular glass may be increased. The molecular weight range may be between about 300 grams/mole (g/mole) and about 100,000 g/mole, such as between about 800 g/mole and about 30,000 g/mole. In one embodiment, a maximum molecular weight for the molecular glass may be about 3,000 g/mole, and about 100,000 g/mole for the linked molecular glass, for example.

Breakage of the linkages may occur via acid catalyzed cleavage (such as through exposure to radiation or a particle beam during a photolithography process in the presence of a photoacid generator), wherein the size and molecular weight may be reduced back to that of the molecular glass compound. A resist composition of the present invention incorporating molecular glasses or linked molecular glasses may be essentially free of polymer or resin component having a backbone structure which is acid-inert, wherein such an acid-inert backbone structure of a polymer or resin does not undergo acid catalyzed cleavage.

In an embodiment of the present invention, the composition may further comprise a photosensitive acid generator (PAG). For example, the PAG may comprise: (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, sulfonic acid esters of N-hydroxyamides, imides, or combinations thereof.

In an embodiment of the present invention, the composition may further comprise a surfactant. Surfactants may be used to improve coating uniformity, and may include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Union Carbide Corporation in Danbury, Conn.

The composition of the present invention may include a casting solvent to dissolve the other components, so that the overall composition may be applied evenly on the substrate surface to provide a defect-free coating. Where the composition is used as a photoresist in a multilayer imaging process, the solvent used in the imaging layer photoresist may not be a solvent to the underlayer materials, otherwise the unwanted intermixing may occur. Examples of suitable casting solvents may include: ethoxyethylpropionate (EEP), a combination of EEP and gamma-butyrolactone (GBL), propylene glycol methyl ether acetate (PGMEA), and ethyl lactate. The present invention is not limited to the selection of any particular solvent.

The composition of the present invention may include a base quencher, sensitizers or other expedients known in the art. The compositions of the present invention are not limited to any specific selection of these expedients, where base quenchers may comprise aliphatic amines, aromatic amines, carboxylates hydroxides, or combinations thereof. For example base quenchers may include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines such as in the PLURONIC or TETRONIC series commercially available from BASF. Tetra alkyl ammonium hydroxides or cetyltrimethyl ammonium hydroxide may be used as a base quencher when the PAG is an onium salt.

The composition of the present invention is not limited to any specific proportions of the various components. The composition of the present invention may include from about 0.2 to about 30 weight percent (wt. %) PAG, such as from about 0.5 to about 15 wt. %, based on the total weight of molecular glass in the composition. The resist composition may contain from about 0.02 to about 20 wt. % of a base quencher, such as about 0.05 to about 10 wt. %, based on the total weight of molecular glass in the composition. Where the compositions of the present invention contain a solvent, the overall composition may contain from about 50 to about 99 wt. % solvent.

FIG. 1 is a flow chart illustrating a method for preparing a patterned feature on a substrate in an embodiment of the present invention. In step 110, a film of a composition is formed on a substrate, where the composition may comprise a compound, such as a molecular glass or a linked molecular glass, having at least one fused polycyclic moiety and at least one base soluble functional group, and a photosensitive acid generator as described above. The composition may further comprise a surfactant and/or a base quencher as described above. The film may be formed by processes such as spin coating, spray coating, dip coating, doctor-blading, roll coating, and the like, which may be used individually or in combinations thereof in accordance with the methods of the present invention. The substrate may comprise materials of the Group 4, 6, 11, 12, 13, 14, and 15 elements, plastic material, silicon dioxide, glass, fused silica, mica, ceramic, metals deposited on the aforementioned substrates, combinations thereof, and the like. The substrate may comprise a stack or layering of different materials. For a substrate used in a trilayer approach, there may be a comparatively thick organic underlayer and a thin Si containing interlayer, where the Si containing layer may either be a chemical vapor deposited silicon oxide layer or a spin coated silsesquioxane polymer film. For example, a substrate may comprise a prepared silicon wafer substrate such as those employed in semiconductor manufacturing. The film may be disposed on top of the substrate or may be integrally joined with the substrate.

In step 115, the film is imaged patternwise using a radiation or particle beam source, resulting in the photosensitive acid generator producing an acid catalyst in the exposed regions of the film, wherein acid catalyzed bond cleavage reactions may occur at acid cleavable linkages such as acid labile protecting groups for base soluble functional groups and acid cleavable linkages in linked molecular glasses, for example.

Figure 2:
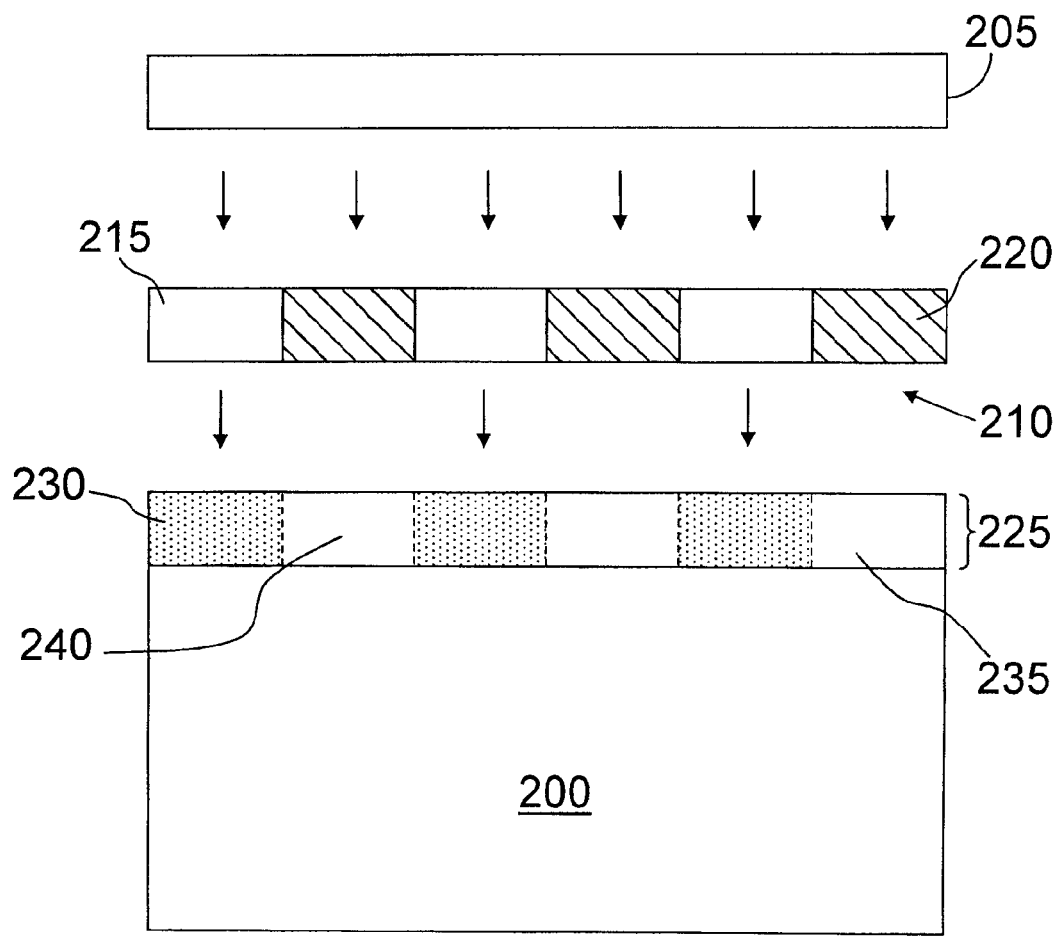
FIG. 2 is an illustration of patternwise imaging, in accordance with embodiments of the present invention.

FIG. 2 is an illustration of patternwise imaging, wherein a radiation or particle beam source 205 projects radiation or energetic particles through a patterned mask 210 onto a film 225 disposed on a substrate 200. The mask may have a pattern of masked sections 220 which are substantially opaque to the radiation or impenetrable to the energetic particles, and unmasked sections 215 which are substantially transparent to the radiation or penetrable to the energetic particles. For charged energetic particles, a direct write exposure may be used, where a mask may not be utilized and the exposure may be guided by electrical and/or magnetic fields to directly write on the film 225. Radiation or particles passing through the unmasked sections 215 may be transmitted to the film 225 to be absorbed in the exposed regions 230 of the film 225, wherein the radiation or particles may induce the production of an acid catalyst in the exposed regions 230 of the film 225. Unexposed regions 240 may not produce an acid catalyst.

Exposure to the radiation or energetic particles may render the exposed regions 230 soluble in a developer. The photoresist compositions of the present invention may be patternwise imaged using radiation such as ultraviolet (UV) such as wavelengths of approximately 436 nanometers (nm) and 365 nm, deep-ultraviolet (DUV) such as wavelengths of approximately 257 nm, 248 nm, 193 nm, and 157 nm, extreme-ultraviolet (EUV) such as a wavelength of approximately 4 nm to approximately 70 nm such as approximately 13 nm, x-ray, combinations of these, and the like. Various wavelengths of radiation may be used such as 313 nm, 334 nm, 405 nm, and 126 nm etc., where the sources may be mainly from specific mercury emission lines or specific lasers. For high performance lithography, single wavelength and/or narrow band radiation sources may be used. For less stringent conditions, a broad band multiple wavelength source may be used. The photoresist compositions of the present invention may be patternwise imaged using particle beams such as electron beam, ion beam, combinations of these, and the like. The appropriate radiation or particle beam type(s) may depend on the components of the overall photoresist composition (e.g., the selection of the molecular glass composition, photosensitive acid generator (PAG), base (or quencher), surfactant, solvent, etc.).

Referring again to FIG. 1, in step 120, the film may be post exposure baked. The post-exposure bake may be conducted in a range from about 60° C. to about 175° C., such as from about 90° C. to about 160° C. The post-exposure bake may be conducted for about 30 seconds to 5 minutes.

In step 125, the film is developed and the base soluble exposed regions of the film may be removed from the film to leave a patterned feature remaining from the unexposed, insoluble regions of the film. The developer may be organic or aqueous based, such as an alkaline aqueous developer such as tetramethylammonium hydroxide, for example.

In step 130, the patterned feature may then be transferred to the underlying substrate (e.g., organic dielectric, ceramic, metal or semiconductor). The transfer may be achieved by dry etching (e.g., reactive ion etching, plasma etching, ion beam, etc.), wet etching, other suitable techniques, or combination of these. A hard mask may be used below the resist to facilitate transfer of the pattern to a further underlying material layer or section. The process ends at 135.

EXAMPLE 1

Synthesis of methoxycyclohexene Protected 9,10-bis(3,5-dihydroxyphenyl)anthracene (BDHPA-MOCH)

Approximately 10 g of propylene glycol methyl ether acetate (PGMEA) was added to 600 mg of 9,10-bis(3,5-dihydroxyphenyl)anthracene (BDHPA), and this mixture was stirred for a few hours, during which the solution did not turn clear. The unclear solution was then added to approximately 13 mg of oxalic acid. After the acid was dissolved, an excess amount of 1-methoxycyclohexene (approximately 2.4 g) was added to the solution, and the reaction was stirred overnight at room temperature, during which the solution became clear. The reaction was then quenched with about 2.6 g of basic active aluminum oxide.

EXAMPLE 2

Synthesis of methoxycyclohexene Protected 3,3,3',3'-tetramethyl-1,1'-spirobiindane-5,5',6,6'-tetraol (TSPT-MOCH).

Approximately 31.5 g of propylene glycol methyl ether acetate (PGMEA) was added to 3.5 g of 3,3,3',3'-tetramethyl-1,1'-spirobiindane-5,5',6,6'-tetraol (TSPT), and this mixture was stirred for a few hours, during which the solution did not turn clear. The unclear solution was then added to approximately 30 mg of oxalic acid. After the acid was dissolved, an excess amount of 1-methoxycyclohexene (about 7.7 g) was added to the solution, and the reaction was stirred overnight at room temperature, during which the solution became clear. The reaction was then quenched with 5 g of basic active aluminum oxide.

EXAMPLE 3

Synthesis of methoxycyclohexene Protected 9,10-bis(3,5-dihydroxyphenyl)anthracene Linked with 1,4-cyclohexanedimethanol divinylether (BDHPA-DVE-MOCH)

Approximately 14.25 g of propylene glycol methyl ether acetate (PGMEA) was added to 750 mg of 9,10-bis(3,5-dihydroxyphenyl) anthracene (BDHPA), 0.309 g 1,4-cyclohexanedimethanol divinylether, and 19.8 mg of trifluoroacetic acid. The mixture solution was stirred for a few days at room temperature, during which the solution became murky but not clear. After 0.78 g of 1-methoxycyclohexene was added to the solution, the solution became clear after approximately 5-6 hours of stirring. The reaction was then quenched the next day with about 4 g of basic active aluminum oxide.

EXAMPLE 4

Synthesis of methoxycyclohexene Protected 3,3,3',3'-tetramethyl-1,1'-spirobiindane-5,5',6,6'-tetraol Linked with 1,4-cyclohexanedimethanol divinylether (TSPT-DVE-MOCH)

Approximately 45.99 g of propylene glycol methyl ether acetate (PGMEA) was added to 5.11 g of 3,3,3',3'-tetramethyl-1,1'-spirobiindane-5,5',6,6'-tetraol (TSPT), 2.48 g of 1-methoxycyclohexene, and about 65 mg of trifluoroacetic acid. The mixture solution was stirred overnight at room temperature, and the solution remained unclear on the second day. The mixture was added to about 2.41 g of 1,4-cyclohexanedimethanol divinylether, and the reaction was again stirred overnight at room temperature, after which the solution became clear on the third day. An additional 2.55 g of 1-methoxycyclohexene was added to the solution, and the reaction was then quenched on the fourth day of stirring with about 5.5 g of basic active aluminum oxide.

EXAMPLE 5

Resist Formulation and Lithographic Analysis

Resists (A-D) were formulated by mixing each of the molecular glasses and linked molecular glasses synthesized above (Example 1-4) with 5.6 weight % (wt %) triphenylsulfonium perfluorobutane sulfonate (TPS PFBUS) PAG, 0.28 wt % tetrabutylammonium hydroxide (TBAH) quencher, and about 200 to about 1000 ppm of FLUORAD FC-430 surfactant (available from 3M Company) in PGMEA solvent. The weight percent (wt %) of each component is relative to the weight of the compound (molecular glass or linked molecular glass) in the resist formulation.

The resists were spin coated onto HMDS (hexamethyldisilazane) primed wafers. The films were baked on a hot plate between about 90° C. to about 110° C. for about 1 minute. The exposures were performed on a 100 kV Leica exposure system. After exposure, resist samples were either 1) post-exposure baked at 90-110° C. for 1 minute or 2) received only a wait time of approximately 30 minutes without PEB, before being developed with 0.26N tetramethylammonium hydroxide (TMAH) for about 20 seconds (s) to about 60 s.

Resist A resolved 60 nm l/s without post exposure bake. Resist B did not resolve 60 nm l/s images, but exhibited 30 nm l/s resolution by blending the resist with MOCH protected polyvinylphenol resist. Resist C and D both resolved 30 nm l/s images.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A method for forming a patterned feature on a substrate, comprising:

providing a composition free of a polymeric component having an acid-inert backbone structure, said composition comprising a photosensitive acid generator and a linked molecular glass having two fused polycyclic moieties and at least one hydroxyl group protected by a methoxycyclohexyl group, said two fused polycyclic moieties comprising

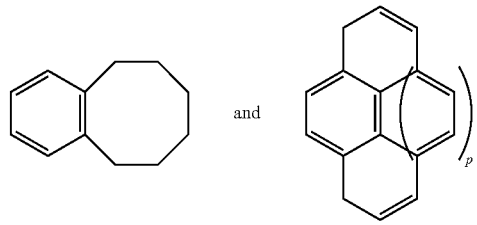

wherein p is 7, said linked molecular glass comprising three molecular glass moieties linked via acid cleavable acetal linkages between adjacent molecular glass moieties, said photosensitive acid generator comprising N-hydroxy-naphthalimide, said linked molecular glass having a molecular weight less than about 100,000 g/mole, said composition further comprising a fluorine containing surfactant and a base quencher comprising an aliphatic amine;

dip coating a film of said composition onto said substrate, said substrate comprising a silicon wafer having an organic underlayer and a silsesquioxane polymer film spin coated thereon;

patternwise imaging said film, wherein at least one region of said film is exposed to an electron beam, resulting in production of an acid catalyst in said at least one exposed region of said film, resulting in acid catalyzed bond cleavage reactions occurring at said acid cleavable acetal linkages;

after said imaging, baking said film on said substrate at a temperature in a range from about 90° C. to about 160° C.;

after said baking, developing said film in an aqueous base solution, resulting in removal of base-soluble exposed regions of said film, wherein a patterned feature from said film remains following said removal; and after said developing, transferring said patterned feature to said substrate, said transferring achieved by a wet etching technique.

* * * * *